(12) United States Patent
Chen et al.

(10) Patent No.: US 9,377,582 B2
(45) Date of Patent: Jun. 28, 2016

(54) SUBSTRATE, RELATED DEVICE, AND RELATED MANUFACTURING METHOD

(71) Applicant: SEMICONDUCTOR MANUFACTURING INTERNATIONAL (SHANGHAI) CORPORATION, Shanghai (CN)

(72) Inventors: Fucheng Chen, Shanghai (CN); Herb He Huang, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/549,718

(22) Filed: Nov. 21, 2014

(65) Prior Publication Data

US 2015/0185418 A1 Jul. 2, 2015

(30) Foreign Application Priority Data

Dec. 31, 2013 (CN) .......................... 2013 1 0753545

(51) Int. Cl.
| | | |
|---|---|---|
| *G01N 21/03* | (2006.01) | |
| *H01L 21/461* | (2006.01) | |
| *G02B 6/136* | (2006.01) | |
| *H01L 21/311* | (2006.01) | |
| *H01L 23/48* | (2006.01) | |

(Continued)

(52) U.S. Cl.
CPC ............ *G02B 6/136* (2013.01); *G02B 6/12002* (2013.01); *H01L 21/308* (2013.01); *H01L 21/30604* (2013.01); *H01L 21/31111* (2013.01); *H01L 21/31144* (2013.01); *H01L 21/76804* (2013.01); *H01L 23/481* (2013.01); *G02B 2006/12061* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 2004/0190814 A1* | 9/2004 | Suzuki | ................... | B82Y 20/00 385/14 |
| 2005/0171277 A1* | 8/2005 | Li | ........................ | C09D 183/04 524/588 |

(Continued)

OTHER PUBLICATIONS

Rola et al. "Silicon 45° micromirrors fabricated by etching in alkaline solutions with organic additives" Microsystem Technologies Jun. 20, 2013, vol. 20, Issue 2, pp. 221-226.*

(Continued)

*Primary Examiner* — Calvin Choi
*Assistant Examiner* — Xiaoming Liu
(74) *Attorney, Agent, or Firm* — Innovation Counsel LLP

(57) ABSTRACT

A method for manufacturing a substrate may include processing a substrate material member to form a first remaining portion. The first remaining portion has a first cavity. A sidewall the first cavity is oriented at a first angle with respect to at least one of a horizontal plane and a bottom side of the first remaining portion. The method may further include providing a sacrificial material member in the first cavity. The method may further include processing the sacrificial material member when processing the first remaining portion to remove the sacrificial material member and to form a second remaining portion. The second remaining portion has a second cavity. A sidewall the second cavity is oriented at a second angle with respect to at least one of the horizontal plane and a bottom side of the second remaining portion. The second angle is smaller than the first angle.

20 Claims, 5 Drawing Sheets

(51) Int. Cl.
*H01L 21/768* (2006.01)
*H01L 21/306* (2006.01)
*H01L 21/308* (2006.01)
*G02B 6/12* (2006.01)

(56) References Cited

U.S. PATENT DOCUMENTS

| | | | | |
|---|---|---|---|---|
| 2006/0093844 | A1* | 5/2006 | Conklin | C08L 75/04 428/500 |
| 2006/0292877 | A1* | 12/2006 | Lake | H01L 21/30655 438/694 |
| 2013/0010275 | A1* | 1/2013 | Medvedev | B82Y 10/00 355/71 |
| 2013/0177274 | A1* | 7/2013 | Kosenko | G02B 6/3692 385/14 |
| 2013/0237062 | A1* | 9/2013 | Winniczek | H01L 21/30655 438/719 |
| 2014/0231125 | A1* | 8/2014 | Chen | H05K 3/281 174/261 |

OTHER PUBLICATIONS

Akihiro Noriki, et al., "Through Silicon Photonic Via (TSPV) with Si Core for Low Loss and High-Speed Data Transmission in Opto-Electronic 3-D LSI", Proceedings of 3D Systems Integration Conference (3DIC), 2010 IEEE International, Nov. 2010, 4 pages (pp. 181-184).

Akihiro Noriki, et al., "Through Silicon Photonic Via and Unidirectional Coupler for High Speed Data Transmission in Optoelectronic Three-Dimensional Lsi", IEEE Electron Device Letters, vol. 33, No. 2, February 2012, pp. 221-223.

* cited by examiner

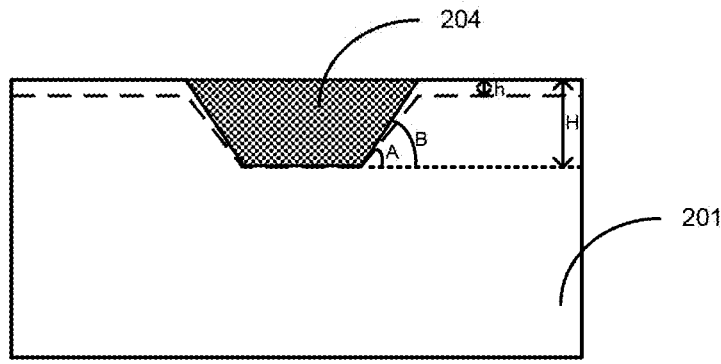

FIG. 4

S501 Preparing a substrate material member; processing the substrate material member to form a first remaining portion of the substrate material member, wherein the first remaining portion of the substrate material member has a first cavity, wherein a sidewall the first cavity is oriented at a first angle with respect to at least one of a horizontal plane, a bottom surface of the first cavity, and a bottom side of the first remaining portion of the substrate material member.

S502 Providing a sacrificial material member in the first cavity.

S503 Processing the sacrificial material member when processing the first remaining portion of the substrate material member to remove the sacrificial material member and to form a second remaining portion of the substrate material member, wherein the second remaining portion of the substrate material member has a second cavity, wherein a sidewall the second cavity is oriented at a second angle with respect to at least one of the horizontal plane, a bottom surface of the second cavity, and a bottom side of the second remaining portion of the substrate material member, and wherein the second angle is smaller than the first angle.

FIG. 5

SUBSTRATE, RELATED DEVICE, AND RELATED MANUFACTURING METHOD

CROSS-REFERENCE TO RELATED APPLICATION

This application claims priority to and benefit of Chinese Patent Application No. 201310753545.5, filed on 31 Dec. 2013, the Chinese Patent Application being incorporated herein by reference in its entirety.

BACKGROUND OF THE INVENTION

The present invention is related to a substrate (e.g., a semiconductor substrate), a method for manufacturing the substrate, a device that includes the substrate, and a method for manufacturing the device.

An electronic device may include a three-dimensional integrated circuit (3D IC). The 3D IC may include a plurality of chips that are integrated vertically and horizontally into a circuit.

The 3D IC may include through-silicon vias (TSVs) and/or other interconnection structures for enabling connection between chips. Among TSVs, a through-silicon photonic via (TSPV) may be used for facilitating connection between optical devices, such as waveguide devices. The efficiency of a TSPV connection may depend on one or more structures, e.g., one or more reflective trench sidewalls, in one or more related semiconductor substrates.

A trench sidewall slanted at an angle with a substantially unsuitable size may require additional optical arrangements and/or may not enable a satisfactorily efficient TSPV connection.

SUMMARY

An embodiment of the present invention may be related to a method for manufacturing a substrate, such as a semiconductor substrate. The method may include preparing a substrate material member. The method may include processing the substrate material member to form a first remaining portion of the substrate material member. The first remaining portion of the substrate material member may have a first cavity (e.g., a first trench). A sidewall the first cavity may be oriented (e.g., slanted) at a first angle with respect to at least one of a horizontal plane, a bottom surface of the first cavity, and a bottom side of the first remaining portion of the substrate material member. The method may further include providing a sacrificial material member in the first cavity. The sacrificial material member may substantially completely fill the first cavity. The method may further include processing the sacrificial material member when processing the first remaining portion of the substrate material member to substantially completely remove the sacrificial material member and to form a second remaining portion of the substrate material member. The second remaining portion of the substrate material member may have a second cavity (e.g., a second trench). A sidewall the second cavity may be oriented (e.g., slanted) at a second angle with respect to at least one of the horizontal plane, a bottom surface of the second cavity, and a bottom side of the second remaining portion of the substrate material member. The second angle may be less than the first angle. A depth of the second cavity may be less than a height of the sacrificial material member.

The first angle may be in a range of 54 degrees to 56 degrees. The second angle may be in a range of 44.5 degrees to 45.5 degrees. The second angle may be 45 degrees. A length of the sidewall of the second cavity may be in a range of 3 microns to 15 microns.

An etching process may be performed to remove the sacrificial material member and to form the second remaining portion of the substrate material member. In the etching process, a ratio of an etch rate of the sacrificial material member to an etch rate of the first remaining portion of the substrate material member may be in a range of 3.3 to 3.5.

An etching process may be performed to remove the sacrificial material member and to form the second remaining portion of the substrate material member. In the etching process, a ratio of an etch rate of the sacrificial material member to an etch rate of the first remaining portion of the substrate material member may be 3.4.

The method may include using the first angle and a height of the sacrificial material member to determine a target depth for the second cavity. The target depth of the second cavity may be set as the height of the sacrificial material member divided by the tangent of the first angle. In an embodiment, the first angle may be in a range of 54 degrees to 56 degrees, and a ratio of the height of the sacrificial material member to the target depth of the second cavity may be in a range of about 1.37 to about 1.49. In an embodiment, the first angle may be about 54.74 degrees (approximating an angle between two crystallographic planes in the substrate material), and the target depth of the second cavity may be set as the height of the sacrificial material member divided by the tangent of 54.74 degrees (which may be about 1.414).

A process for forming the first remaining portion of the substrate material member may include the following steps: providing a mask material layer on the substrate material member; providing a photoresist layer on the mask material layer, wherein the photoresist layer may have a first pattern; etching the mask material layer when the photoresist layer is positioned on the mask material layer to form a mask that may have a second patter, wherein the second pattern may be similar to or identical to the first pattern; and etching the substrate material member when the mask is positioned on the substrate material layer to form the first cavity.

The mask material layer may be formed of one or more of amorphous silicon, silicon oxynitride, silicon oxide, doped silicon oxide, silicon carbide, silicon nitride, titanium, and titanium oxide.

The sacrificial material member may be formed of a wet-developable material.

The sacrificial material member may be formed of a cross-linked resin that may include one or more of the following elements: an organic solvent that may include at least one of a ketone, an ether, and an alkane; an anti-reflection material; an organic acid group resin that may be reactive to a standard tetramethyl ammonium hydroxide developer solution; and an organic group resin that may include at least one of oxygen and fluorine.

A molecular weight of the sacrificial material member may be in a range of 1000 to 50,000. A refractive index of the sacrificial material member may be in a range of 1.0 to 3.0. An extinction coefficient of the sacrificial material member may be in a range of 0.1 to 3.0.

A process for forming the sacrificial material layer may include the following steps: providing a set of sacrificial material that may include a first coating of sacrificial material and covers the first remaining portion of the substrate material member; determining whether the set of sacrificial material satisfy a set of planarization requirements; if the set of planarization requirements is satisfied, planarizing the set of sacrificial material to form the sacrificial material member, such that a top surface of the sacrificial material member and a top surface of the first remaining portion of the substrate material member are in a same plane; and if the set of planarization requirements is not satisfied, providing an additional coating of sacrificial material that covers the first remaining portion of the substrate material member. One or more of these steps may be repeated if the set of planarization requirements is not satisfied.

The method may include performing a heating process (e.g., a baking process) on the first coating of sacrificial material after providing the first coating of sacrificial material on the first remaining portion of the substrate material member. The sacrificial material amount of the first coating of sacrificial material may be in a range of 0.5 milliliter to 5 milliliters. The heating process may be performed at a temperature that is in a range of 60 degrees Celsius to 250 degrees Celsius for a time duration that is in a range of 10 seconds to 120 seconds.

The method may include the following steps: providing a first anti-reflection layer on the bottom surface of the second cavity; providing a semiconductor material member in the second cavity; and providing a second anti-reflection layer on the semiconductor material member.

An embodiment of the present invention may be related to a method for manufacturing a semiconductor device. The method may include the following steps: preparing a first substrate material member; processing the first substrate material member to form a first remaining portion, wherein the first remaining portion may have a first cavity, wherein a sidewall the first cavity may be oriented at a first angle with respect to at least one of a horizontal plane, a bottom surface of the first cavity, and a bottom side of the first remaining portion; providing a first sacrificial material member in the first cavity; processing the first sacrificial material member when processing the first remaining portion to remove the first sacrificial material member and to form a second remaining portion, wherein the second remaining portion may have a second cavity, wherein a sidewall the second cavity may be oriented at a second angle with respect to at least one of the horizontal plane, a bottom surface of the second cavity, and a bottom side of the second remaining portion, and wherein the second angle may be smaller than the first angle; preparing a first device member using the second remaining portion; preparing a second substrate material member; processing the second substrate material member to form a third remaining portion, wherein the third remaining portion may have a third cavity, wherein a sidewall the third cavity may be oriented at a third angle with respect to at least one of the horizontal plane, a bottom surface of the third cavity, and a bottom side of the third remaining portion; providing a second sacrificial material member in the third cavity; processing the second sacrificial material member when processing the third remaining portion to remove the second sacrificial material member and to form a fourth remaining portion, wherein the fourth remaining portion may have a fourth cavity, wherein a sidewall the fourth cavity may be oriented at a fourth angle with respect to at least one of the horizontal plane, a bottom surface of the fourth cavity, and a bottom side of the fourth remaining portion, and wherein the fourth angle may be smaller than the third angle; preparing a second device member using the fourth remaining portion; and positioning at least one of the first device member and the second device member such that the sidewall of the second cavity overlaps the sidewall of the fourth cavity in a direction perpendicular to at least one of the side of the bottom surface of the fourth cavity and the bottom side of the fourth remaining portion.

Each of the second angle and the fourth angle may be 45 degrees or may approximate 45 degrees, e.g., in a range of 44.5 degrees to 45.5 degrees.

The method may include the following steps: providing a cladding layer between the first device member and the second device member, wherein the cladding layer may include a transmission member (e.g., a TSPV member); and positioning the transmission member between the sidewall of the second cavity and the sidewall of the fourth cavity.

An embodiment of the present invention may be related to a semiconductor device. The semiconductor device may include the following elements: a first substrate, which may have a first cavity, wherein a sidewall of the first cavity may be oriented at a first angle with respect to at least one of a side of the first substrate and a bottom surface of the first cavity, and wherein the first angle may be 45 degrees or may be approximately 45 degrees, e.g., in a range of 44.5 degrees to 45.5 degrees; and a second substrate, which may overlap the first substrate and may have a second cavity, wherein a sidewall of the second cavity may be oriented at a second angle with respect to at least one a side of the second substrate and a bottom surface of the second cavity, wherein the second angle may be 45 degrees or may be approximately 45 degrees, e.g., in a range of 44.5 degrees to 45.5 degrees, and wherein the sidewall of the first cavity may overlap (and/or may be aligned with) the sidewall of the second cavity in a direction perpendicular to the side of the second substrate.

According to embodiments of the invention, a substrate (e.g., a semiconductor substrate) may include a reflective surface oriented at 45 degrees or approximately 45 degrees with respect to at least one of a bottom side of the substrate, an intended light incident direction, and an intended light reflection direction. Advantageously, the substrate may enable substantially efficient photonic connection (e.g., through a TSPV) and/or may enable a relatively simple connection structure in a related device (e.g., a semiconductor device that includes the substrate). Semiconductor devices (and related electronic devices) according to embodiments of the invention may have more efficient connections (or coupling) and/or may have simpler structures than well-known semiconductor devices (and related electronic devices).

The above summary is related to one or more of many embodiments of the invention disclosed herein and is not intended to limit the scope of the invention.

BRIEF DESCRIPTION OF THE DRAWINGS

FIG. 4 shows a schematic diagram (e.g., a schematic cross-sectional view) that illustrates one or more structures formed in a method for manufacturing a substrate (e.g., a semiconductor substrate) in accordance with one or more embodiments of the present invention.

FIG. 5 shows a flowchart that illustrates a method for manufacturing a substrate (e.g., a semiconductor substrate) in accordance with one or more embodiments of the present invention.

DETAILED DESCRIPTION

Figure 1A:
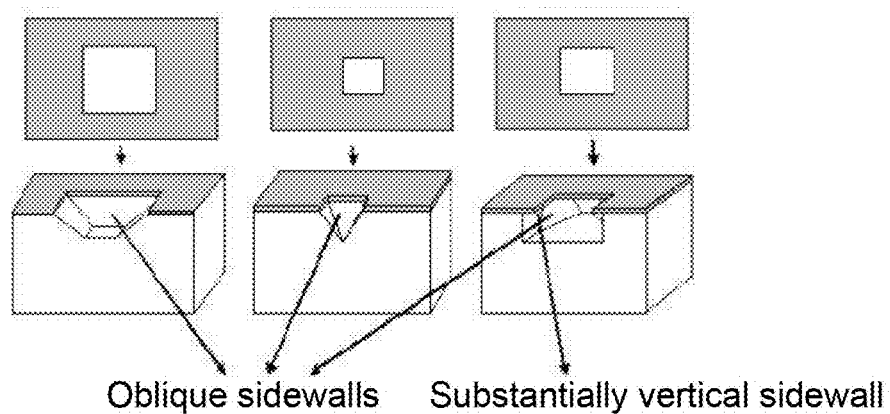
FIG. 1A shows a schematic diagram that illustrates trenches that may be formed in a semiconductor device in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

FIG. 1A shows a schematic diagram that illustrates trenches that may be formed in a semiconductor device in accordance with one or more embodiments of the present invention. As illustrated in FIG. 1A, the trenches may have oblique sidewalls and/or substantially vertical sidewalls. The oblique sidewalls may perform reflection for enabling TSPV connections. The orientations of the sidewalls may be substantially affected by crystallographic planes of the crystal structure of the associated semiconductor substrate(s). For example, a semiconductor substrate may be a silicon substrate, and an oblique sidewall of a trench formed in the silicon substrate may be slanted with respect to an associated trench bottom and/or with respect to the bottom side of the silicon substrate at an angle that approximates an angle between two crystallographic planes of a silicon crystal structure.

Figure 1B:
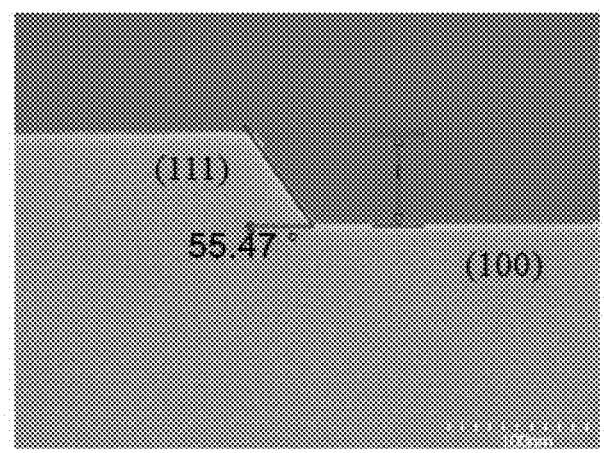
FIG. 1B shows a schematic diagram that illustrates a trench formed in silicon substrate in accordance with one or more embodiments of the present invention.

FIG. 1B shows a schematic diagram that illustrates a trench formed in silicon substrate in accordance with one or more embodiments of the present invention. An oblique sidewall of the trench may be slated at 55.47 degrees with respect to the bottom of the trench. The 55.47 degrees may approximate the 54.74 degrees between a 111 crystallographic plane and a 100 crystallographic plane of the silicon crystal structure.

Figure 2A:
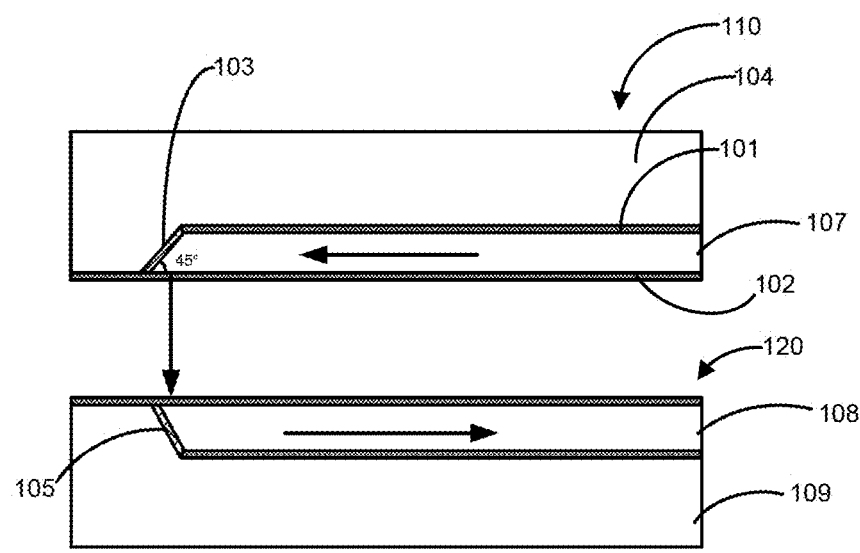
FIG. 2A shows a schematic diagram (e.g., a schematic cross-sectional view) that illustrates a device (e.g., a semiconductor device) in accordance with one or more embodiments of the present invention.

FIG. 2A shows a schematic diagram (e.g., a schematic cross-sectional view) that illustrates a device (e.g., a semiconductor device) in accordance with one or more embodiments of the present invention. The device may include a first device member 110 and a second device member 120.

The first device member may include a first substrate 104, which may have a first cavity 107. A sidewall 103 of the first cavity 107 may be oriented at a first angle with respect to at least one of a side (e.g., a top side) of the first substrate, a bottom surface of the first cavity 107, a transmission direction of a light transmitted in the first cavity 107, and a transmission direction of a light transmitted between the first device member 110 and the second device member 120. The sidewall 103 may be reflective and/or may have a reflective coating. The first angle may be 45 degrees or may be approximately 45 degrees, e.g., in a range of 44.5 degrees to 45.5 degrees.

The first device member 110 may include the following elements: a first anti-reflection layer 101 positioned on the bottom surface of the first cavity 107; a semiconductor material member positioned inside the first cavity; and a second anti-reflection layer 102 positioned on the semiconductor material member. The anti-reflection layers and the semiconductor material member may facilitate efficient transmission of light in the first cavity 107.

The second device member 120 may include a second substrate 109, which may overlap the first substrate 107 and may have a second cavity 108. A sidewall 105 of the second cavity may be oriented at a second angle with respect to at least one of a side (e.g., a bottom side) of the second substrate, a bottom surface of the second cavity 108, a transmission direction of a light transmitted in the second cavity 108, and a transmission direction of a light transmitted between the first device member 110 and the second device member 120. The sidewall 105 may be reflective and/or may have a reflective coating. The second angle may be 45 degrees or may be approximately 45 degrees, e.g., in a range of 44.5 degrees to 45.5 degrees. The sidewall 103 of the first cavity 107 may overlap (and/or may be aligned with) the sidewall 105 of the second cavity 109 in a direction perpendicular to the side (e.g., the bottom side) of the second substrate.

The second device member 102 may include anti-reflection layers and a semiconductor material member, e.g., analogous to those included in the first device member 101, for facilitating efficient light transmission in the second cavity 108.

Given the substantially 45-degree orientation of each of the sidewall 103 and sidewall 105, efficient coupling (or connection) between the first device member 110 and the second device member 120 may be enabled without requiring very complicated transmission structure and/or may additional components.

A method for manufacturing the device illustrated in FIG. 2A may include the following steps: preparing a first substrate material member; processing the first substrate material member to form a first remaining portion, wherein the first remaining portion may have a first preliminary cavity, wherein a sidewall the first preliminary cavity may be oriented at a first preliminary angle with respect to at least one of a horizontal plane, a bottom surface of the first preliminary cavity, and a bottom side of the first remaining portion; providing a first sacrificial material member in the first preliminary cavity; processing the first sacrificial material member when processing the first remaining portion to remove the first sacrificial material member and to form a second remaining portion, wherein the second remaining portion may have the first cavity 107, wherein the sidewall 103 the first cavity 107 may be oriented at a first angle with respect to at least one of the horizontal plane, a bottom surface of the first cavity 107, and a bottom side of the second remaining portion, and wherein the first angle may be smaller than the first preliminary angle; preparing the first device member 110 using the second remaining portion (which may be the first substrate 104 or may be used for preparing the first substrate 104); preparing a second substrate material member; processing the second substrate material member to form a third remaining portion, wherein the third remaining portion may have a second preliminary cavity, wherein a sidewall the second preliminary cavity may be oriented at a second preliminary angle with respect to at least one of the horizontal plane, a bottom surface of the second preliminary cavity, and a bottom side of the third remaining portion; providing a second sacrificial material member in the second preliminary cavity; processing the second sacrificial material member when processing the third remaining portion to remove the second sacrificial material member and to form a fourth remaining portion, wherein the fourth remaining portion may have the second cavity 108, wherein the sidewall 105 the second cavity 108 may be oriented at a second angle with respect to at least one of the horizontal plane, a bottom surface of the second cavity 108, and a bottom side of the fourth remaining portion, and wherein the second angle may be smaller than the second preliminary angle; preparing a second device member 120 using the fourth remaining portion (which may be the second substrate 109 or may be used for preparing the second substrate 109); and positioning at least one of the first device member 110 and the second device member 120 such that the sidewall of the first cavity 107 overlaps the sidewall of the second cavity 108 in a direction perpendicular to at least one of the side of the bottom surface of the second cavity 108 and the bottom side of the fourth remaining portion.

Each of the first angle and the second angle may be 45 degrees or may approximate 45 degrees, e.g., in a range of 44.5 degrees to 45.5 degrees.

A method for forming the first substrate 104 and/or a method for forming the second substrate 109 may include some steps and features that may be analogous to some steps and features discussed below with reference to one or more of FIG. 3A, FIG. 3B, FIG. 3C, FIG. 3D, FIG. 4, and FIG. 5.

Figure 2B:
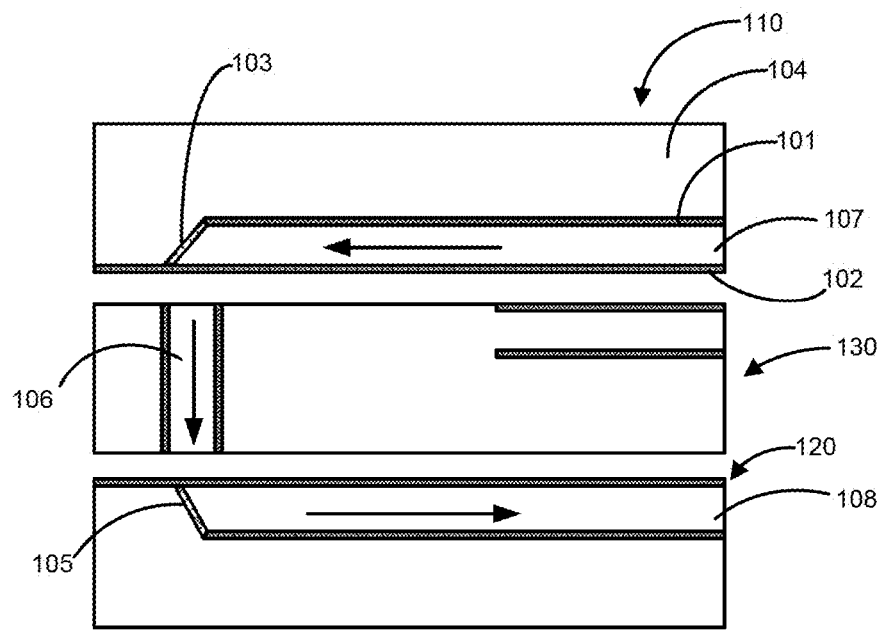
FIG. 2B shows a schematic diagram (e.g., a schematic cross-sectional view) that illustrates a device (e.g., a semiconductor device) in accordance with one or more embodiments of the present invention.

FIG. 2B shows a schematic diagram (e.g., a schematic cross-sectional view) that illustrates a device (e.g., a semiconductor device) in accordance with one or more embodiments of the present invention. The device may illustrated in FIG. 2B may have elements, features, and advantages discussed with reference to FIG. 2A. The device may further include a cladding layer 130 positioned between the first device member 110 and the second device member 120. The cladding layer 130 may include a transmission member 106 (e.g., a TSPV member) positioned between the sidewall 103 of the first cavity 107 and the sidewall 105 of the second cavity 108. The transmission member 106 may include one or more anti-reflection layers and a semiconductor material member, e.g., analogous to those included in the first device member 101, for facilitating efficient light transmission in the transmission member 106.

A method for manufacturing the device illustrated in FIG. 2B may include steps discussed above with reference to FIG. 2A. The method may further include the following steps: providing the cladding layer 130 between the first device member 110 and the second device member 120; and positioning the transmission member 106 between the sidewall 103 of the first cavity 107 and the sidewall 105 of the second cavity 108.

FIG. 3A, FIG. 3B, FIG. 3C, and FIG. 3D show schematic diagrams (e.g., schematic cross-sectional views) that illustrate structures formed in a method for manufacturing a substrate in accordance with one or more embodiments of the present invention. The substrate may be a semiconductor substrate, such as a silicon substrate, a polysilicon substrate, or a silicon-on-insulator (SOI) substrate. FIG. 4 shows a schematic diagram (e.g., a schematic cross-sectional view) that illustrates one or more structures (e.g., the structures illustrated in FIG. 3C and FIG. 3D) formed in a method for manufacturing a substrate (e.g., the substrate related to FIGS. 3A to 3D) in accordance with one or more embodiments of the present invention. FIG. 5 shows a flowchart that illustrates a method for manufacturing a substrate (e.g., the substrate related to FIGS. 3A to 3D) in accordance with one or more embodiments of the present invention.

Referring to FIG. 5, the method may include the following steps: a step S501, a step S502, and a step S503.

Referring to FIG. 5, FIG. 3A, FIG. 3B, and FIG. 4, the step S501 may include the following sub-steps: preparing a substrate material member 201; processing the substrate material member 201 to form a first remaining portion of the substrate material member 201. The first remaining portion of the substrate material member 201 may have a first cavity (e.g., a first trench). A sidewall the first cavity may be oriented (e.g., slanted) at a first angle B with respect to at least one of a horizontal plane, a bottom surface of the first cavity, and a bottom side of the first remaining portion of the substrate material member 201.

The first angle B may be affected by the crystal structure in the substrate material member 201. In an embodiment, the substrate material member 201 may be a silicon member. Being affected by an angle between two crystallographic planes in the crystal structure of the silicon member, the first angle B may be 54.74 degrees or approximately 54.74 degrees. Given the influence of various process variables in forming the first cavity, the value of the first angle B may deviate from the 54.74 value. For example, the deviation may be in a range of −1 degree to 1 degree. The first angle B may be in a range of 54 degrees to 56 degrees.

A process for forming the first remaining portion of the substrate material member 201 may include the following steps: providing a mask material layer on the substrate material member 201; providing a photoresist layer 203 on the mask material layer, wherein the photoresist layer may have a first pattern (which may affect the shape and position of the first cavity); etching (e.g., through dry etching and/or wet etching) the mask material layer when the photoresist layer is positioned on the mask material layer to form a mask 202 that may have a second patter, wherein the second pattern may be similar to or identical to the first pattern (and may affect the shape and position of the first cavity); and etching the substrate material member 201 when the mask 202 is positioned on the substrate material layer to form the first cavity.

The mask material layer may be formed of one or more of amorphous silicon, silicon oxynitride, silicon oxide, doped silicon oxide, silicon carbide, silicon nitride, titanium, and titanium oxide. The thickness of the mask 202 (in a direction perpendicular to bottom surface of the substrate material member 201) may be in a range of 10 nm to 100 nm.

In an embodiment, the mask material layer may be formed of silicon oxide, and a SiConi™ etching process may be performed on the mask material layer to form the mask 202.

A wet-etching process with a TMAH (tetramethyl ammonium hydroxide) solution may be used for etching the substrate material member 201 to form the first cavity. The mass fraction of the TMAH in the TMAH solution may be in a range of 0.1% to 10%. The wet-etching process may be performed at a temperature that is in a range of 25 degrees Celsius to 90 degrees Celsius for a time duration that that is in a range of 10 seconds to 1000 seconds.

After the first cavity has been formed, the mask 202 may be removed. An etching process with substantial etch selectivity may be used for removing the mask 202, for substantially preventing damage to the first cavity and/or the first remaining portion of the substrate material member 201.

Figure 3A:
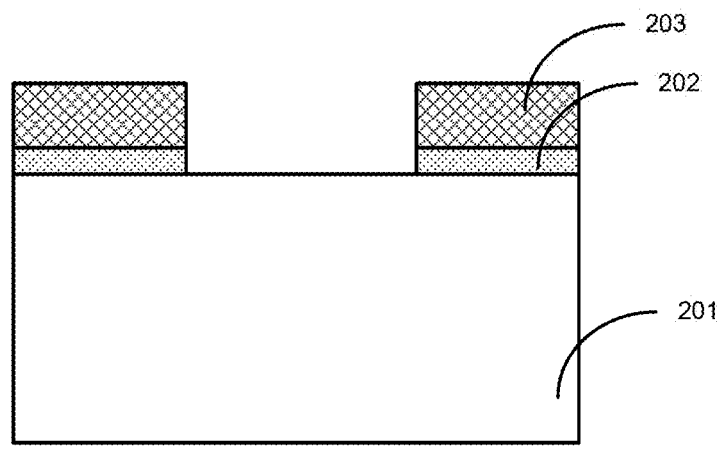
FIG. 3A, FIG. 3B, FIG. 3C, and FIG. 3D show schematic diagrams (e.g., schematic cross-sectional views) that illustrate structures formed in a method for manufacturing a substrate (e.g., a semiconductor substrate) in accordance with one or more embodiments of the present invention.
Figure 3B:
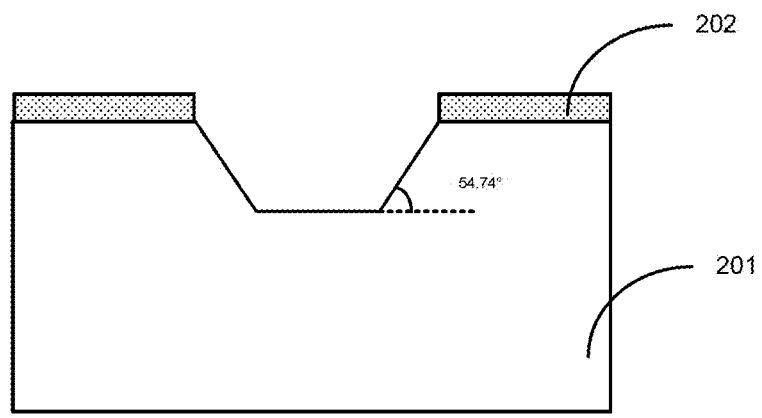
Figure 3C:
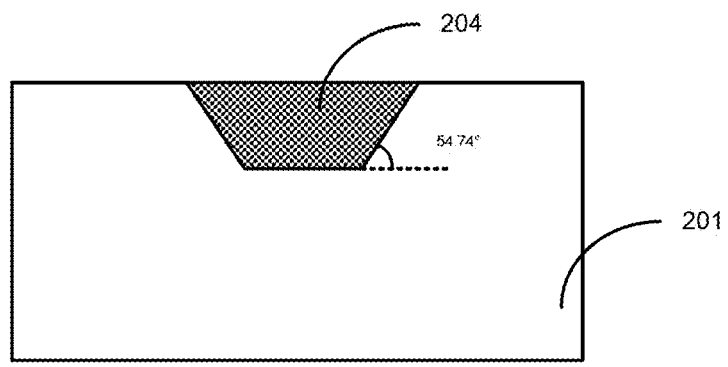
Figure 3D:
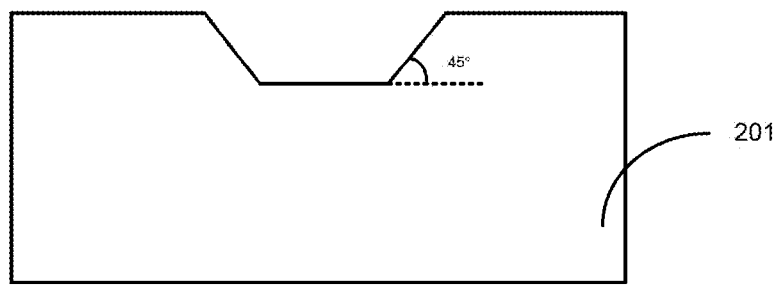

Referring to FIG. 5, FIG. 3C, and FIG. 4, the step S502 may include providing a sacrificial material member 204 in the first cavity. The sacrificial material member 204 may substantially completely fill the first cavity.

The sacrificial material member 204 may be formed of a wet-developable material. The sacrificial material member 204 may be formed of a cross-linked resin that may include one or more of the following elements: an organic solvent that may include at least one of a ketone, an ether, and an alkane; an anti-reflection material; an organic acid group resin that may be reactive to a standard tetramethyl ammonium hydroxide developer solution; and an organic group resin that may include at least one of oxygen and fluorine. A molecular weight of the sacrificial material member 204 may be in a range of 1000 to 50,000. A refractive index of the sacrificial material member 204 may be in a range of 1.0 to 3.0. An extinction coefficient of the sacrificial material member 204 may be in a range of 0.1 to 3.0.

A process for forming the sacrificial material layer may include the following steps: providing a set of sacrificial material that may include a first coating of sacrificial material and covers the first remaining portion of the substrate material member 201; determining whether the set of sacrificial material satisfy a set of planarization requirements; if the set of planarization requirements is satisfied, planarizing the set of sacrificial material to form the sacrificial material member 204, such that a top surface of the sacrificial material member 204 and a top surface of the first remaining portion of the substrate material member 201 are in a same plane; and if the set of planarization requirements is not satisfied, providing an additional coating of sacrificial material that covers the first remaining portion of the substrate material member 201. One or more of these steps may be repeated if the set of planarization requirements is not satisfied.

The method may include performing a heating process (e.g., a baking process) on the first coating of sacrificial material (and/or each additional coating of sacrificial material) after providing the first coating of sacrificial material (and/or each additional coating of sacrificial material) on the first remaining portion of the substrate material member 201. The sacrificial material amount of the first coating of sacrificial material may be in a range of 0.5 milliliter to 5 milliliters. The heating process may be performed at a temperature that is in a range of 60 degrees Celsius to 250 degrees Celsius for a time duration that is in a range of 10 seconds to 120 seconds.

In an embodiment, in forming the sacrificial material member 204, an excess portion of the sacrificial material may be removed through wet-development.

Referring to FIG. 5, FIG. 3C, FIG. 3D, and FIG. 4, the step S503 may include processing the sacrificial material member 204 when processing the first remaining portion of the substrate material member 201 to substantially completely remove the sacrificial material member 204 and to form a second remaining portion of the substrate material member 201. The second remaining portion of the substrate material member 201 may have a second cavity (e.g., a second trench). A sidewall the second cavity may be oriented (e.g., slanted) at a second angle A with respect to at least one of the horizontal plane, a bottom surface of the second cavity, and a bottom side of the second remaining portion of the substrate material member 201. The second angle A may be less than the first angle B. A depth (H–h) of the second cavity may be less than a height H of the sacrificial material member 204, wherein h is the removed thickness of the first remaining portion of the substrate material member 201.

The second angle A may be 45 degrees or approximately 45 degrees. Because of variables in the processing, the second angle A may be in a range of 44.5 degrees to 45.5 degrees. A length of the sidewall of the second cavity may be in a range of 3 microns to 15 microns.

An etching process (e.g., a blank dry etching process without using a mask) may be performed to remove the sacrificial material member 204 and to form the second remaining portion of the substrate material member 201. In the etching process, a ratio of an etch rate of the sacrificial material member 204 to an etch rate of the first remaining portion of the substrate material member 201 may be 3.4 or approximately 3.4, e.g., in a range of 3.3 to 3.5.

The method may include determining the ratio (or etch selectivity) for the etching process based on (the value of) the first angle B. As can be appreciated from FIG. 4, the ratio of the height H of the sacrificial material member 204 to the depth (H–h) is equal to the ratio of the tangent of the first angle B to the tangent of the second angle A, i.e., H/(H–h)= Tangent(B)/Tangent(A). The target second angle A for the etching process may be set to be 45 degrees. Since Tangent(45 degrees) is 1, H/(H–h)=Tangent(B).

In an embodiment, the first angle B may be 54.74 degrees. Therefore, Tangent(54.74 degrees)=H/(H–h), such that the etch selectivity (H/h) for the etching process may be equal to Tangent(54.74 degrees)/[Tangent(54.74 degrees)–1], which is approximately 3.4.

The method may include selecting the material for the sacrificial material element 204 and/or the etchant based on the etch selectivity value (e.g., approximately 3.4).

The method may include using the first angle B and the height H of the sacrificial material member 204 to determine the target depth (H–h) for the second cavity 201. The target depth (H–h) of the second cavity may be set as the height H of the sacrificial material member 204 divided by the tangent of the first angle B. In an embodiment, the first angle B may be in a range of 54 degrees to 56 degrees, and a ratio of the height H of the sacrificial material member to the target depth (H–h) of the second cavity may be in a range of about 1.37 to about 1.49. In an embodiment, the first angle B may be about 54.74 degrees (approximating an angle between two crystallographic planes in the substrate material), and the target depth (H–h) of the second cavity may be set as the height H of the sacrificial material member 204 divided by the tangent of 54.74 degrees (which may be about 1.414).

The method may include fine-tuning the etching process to make the second angle A substantially equal to 45 degrees.

The etching process may be a dry etching process, such as a blank dry etching process involving no masks. The etching process may be performed using nitrogen ($N_2$) as an etching atmosphere. One or more other suitable gasses, such as one or more of carbon tetrafluoride ($CF_4$), carbon dioxide ($CO_2$), and oxygen ($O_2$), of suitable amount(s) may be included in the etching atmosphere. For the etching process, the pressure may be in a range of 50 mTorr to 200 mTorr, such as a pressure in a range of 100 mTorr to 150 mTorr; the power may be in a range of 200 W to 600 W; the time duration may be in a range of 5 seconds to 80 seconds, such as a time duration in a range of 10 seconds to 60 seconds. The gas flow for the etching process may be sufficiently large. In an embodiment, a nitrogen ($N_2$) gas flow for the etching process may be in a range of 30 sccm to 300 sccm. In an embodiment, a nitrogen ($N_2$) gas flow for the etching process may be in a range of 50 sccm to 100 sccm.

The method may include the following steps: providing a first anti-reflection layer (analogous to the anti-reflection layer 101 illustrated in FIG. 2A and FIG. 2B) on the bottom surface of the second cavity; providing a semiconductor material member in the second cavity; performing planarization on the semiconductor material member, such that the top surface of the semiconductor material member and the top surface of the second remaining portion of the substrate material member may be in a same plane; and providing a second anti-reflection layer (analogous to the anti-reflection layer 102 illustrated in FIG. 2A and FIG. 2B) on the semiconductor material member and on the second remaining portion of the substrate material member. Therefore, a waveguide channel may be formed between the first anti-reflection layer and the second anti-reflection layer.

A substrate manufactured according to an embodiment of the invention may include the second remaining portion of the substrate material member. The substrate may include the first anti-reflection layer, the second anti-reflection layer, and the semiconductor material member. The substrate may be used in a device such as the device discussed with reference to at least one of FIG. 2A and FIG. 2B.

According to embodiments of the invention, a substrate (e.g., a semiconductor substrate) may include a reflective surface oriented at 45 degrees or approximately 45 degrees with respect to at least one of a bottom side of the substrate, an intended light incident direction, and an intended light reflection direction. Advantageously, the substrate may enable efficient connection (e.g., through a TSPV) and/or may enable a relatively simple connection structure in a related device (e.g., a semiconductor device that includes the substrate). Semiconductor devices (and related electronic devices) according to embodiments of the invention may have satisfactorily efficient connections (or coupling) and/or may have satisfactorily simple structures.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a substrate, the method comprising:
processing a substrate material member to form a first remaining portion of the substrate material member, wherein the first remaining portion of the substrate material member has a first cavity, wherein a flat sidewall of the first cavity is oriented at a first angle with respect to at least one of a horizontal plane, a flat bottom surface of the first cavity, and a flat bottom side of the first remaining portion of the substrate material member;
providing a sacrificial material member inside the first cavity; and
processing the sacrificial material member when processing the first remaining portion of the substrate material member to remove the sacrificial material member and to form a second remaining portion of the substrate material member, wherein the second remaining portion of the substrate material member has a second cavity, wherein a flat sidewall of the second cavity is resulted from removal of at least the flat sidewall of the first cavity and is oriented at a second angle with respect to at least one of the horizontal plane, a flat bottom surface of the second cavity, and a flat bottom side of the second remaining portion of the substrate material member, and wherein the second angle is smaller than the first angle.

2. The method of claim 1, wherein the first angle is in a range of 54 degrees to 56 degrees.

3. The method of claim 1, wherein the second angle is in a range of 44.5 degrees to 45.5 degrees or is 45 degrees.

4. The method of claim 1, wherein the flat bottom surface of the first cavity is protected by a portion of the sacrificial material member when the flat sidewall of the first cavity is removed, wherein the second cavity is formed when the sacrificial material member is completely removed, and wherein a maximum depth of the second cavity is less than a maximum depth of the first cavity.

5. The method of claim 1, wherein a dry etching process involving no masks is performed to remove the sacrificial material member and to form the second cavity.

6. The method of claim 1, wherein an etching process is performed to remove the sacrificial material member and to form the second cavity, and wherein, in the etching process, a ratio of an etch rate of the sacrificial material member to an etch rate of the first remaining portion of the substrate material member is 3.4 or is in a range of 3.3 to 3.5.

7. The method of claim 1, further comprising: using the first angle and a height of the sacrificial material member to determine a target depth for the second cavity.

8. The method of claim 1, wherein a process for forming the first remaining portion of the substrate material member comprises:
providing a mask material layer on the substrate material member;
providing a photoresist layer on the mask material layer, wherein the photoresist layer has a first pattern;
etching the mask material layer when the photoresist layer is positioned on the mask material layer to form a mask that has a second pattern, wherein the second pattern is similar to or identical to the first pattern; and
etching the substrate material member when the mask is positioned on the substrate material layer to form the first cavity.

9. The method of claim 8, wherein the mask material layer is formed of one or more of amorphous silicon, silicon oxynitride, silicon oxide, doped silicon oxide, silicon carbide, silicon nitride, titanium, and titanium oxide.

10. The method of claim 1, wherein a length of the flat sidewall of the second cavity is in a range of 3 microns to 15 microns.

11. The method of claim 1, wherein the sacrificial material member is formed of a wet-developable material.

12. The method of claim 1, wherein the sacrificial material member comprises:
an organic solvent that includes at least one of a ketone, an ether, and an alkane;
an anti-reflection material;
an organic acid group resin that is reactive to a tetramethyl ammonium hydroxide developer solution; and
an organic group resin that includes at least one of oxygen and fluorine.

13. The method of claim 1, wherein a molecular weight of the sacrificial material member is in a range of 1000 to 50,000, wherein a refractive index of the sacrificial material member is in a range of 1.0 to 3.0, and wherein an extinction coefficient of the sacrificial material member is in a range of 0.1 to 3.0.

14. The method of claim 1, wherein a process for forming the sacrificial material layer comprises:
providing a set of sacrificial material that includes a first coating of sacrificial material and covers the first remaining portion of the substrate material member; and
planarizing the set of sacrificial material to form the sacrificial material member, such that a top surface of the sacrificial material member and a top surface of the first remaining portion of the substrate material member are in a same plane.

15. The method of claim 14, further comprising: performing a heating process on the first coating of sacrificial material after providing the first coating of sacrificial material on the first remaining portion of the substrate material member, wherein a sacrificial material amount of the first coating of sacrificial material is in a range of 0.5 milliliter to 5 milliliters, and wherein the heating process is performed at a temperature in a range of 60 degrees Celsius to 250 degrees Celsius for a time duration in a range of 10 seconds to 120 seconds.

16. The method of claim 1, further comprising:
providing a first anti-reflection layer on the bottom surface of the second cavity;
providing a semiconductor material member in the second cavity; and
providing a second anti-reflection layer on the semiconductor material member.

17. A method for manufacturing a semiconductor device, the method comprising:
processing a first substrate material member to form a first remaining portion, wherein the first remaining portion has a first cavity, wherein a sidewall of the first cavity is oriented at a first angle with respect to at least one of a horizontal plane, a flat bottom surface of the first cavity, and a bottom side of the first remaining portion;
providing a first sacrificial material member in the first cavity;
processing the first sacrificial material member when processing the first remaining portion to remove the first sacrificial material member and to form a second cavity in a second remaining portion, wherein the flat bottom surface of the first cavity is protected by a portion of the first sacrificial material member when the sidewall of the first cavity is removed, wherein a sidewall of the second cavity is oriented at a second angle with respect to at least one of the horizontal plane, a flat bottom surface of the second cavity, and a flat bottom side of the second remaining portion, and wherein the second angle is smaller than the first angle.

18. The method of claim 17, further comprising:

preparing a first device member using the second remaining portion;

processing a second substrate material member to form a third remaining portion, wherein the third remaining portion has a third cavity, wherein a sidewall the third cavity is oriented at a third angle with respect to at least one of the horizontal plane, a bottom surface of the third cavity, and a bottom side of the third remaining portion;

providing a second sacrificial material member in the third cavity;

processing the second sacrificial material member when processing the third remaining portion to remove the second sacrificial material member and to form a fourth remaining portion, wherein the fourth remaining portion has a fourth cavity, wherein a sidewall the fourth cavity is oriented at a fourth angle with respect to at least one of the horizontal plane, a bottom surface of the fourth cavity, and a bottom side of the fourth remaining portion, and wherein the fourth angle is smaller than the third angle;

preparing a second device member using the fourth remaining portion;

positioning at least one of the first device member and the second device member such that the sidewall of the second cavity overlaps the sidewall of the fourth cavity in a direction perpendicular to at least one of the bottom surface of the fourth cavity and the bottom side of the fourth remaining portion;

providing a cladding layer between the first device member and the second device member, wherein the cladding layer includes a transmission member; and positioning the transmission member between the sidewall of the second cavity and the sidewall of the fourth cavity, wherein each of the second angle and the fourth angle is in a range of 44.5 degrees to 45.5 degrees.

19. The method of claim 17, comprising:

using both a value of the first angle and a height value of the first sacrificial material member to determine a target depth value of the second cavity; and forming the second cavity according to the target depth value of the second cavity.

20. A method for manufacturing a substrate, the method comprising:

partially removing a substrate material member to form a first remaining portion of the substrate material member, wherein the first remaining portion of the substrate material member has a first cavity, wherein a flat sidewall of the first cavity is oriented at a first angle with respect to at least one of a horizontal plane, a flat bottom surface of the first cavity, and a flat bottom side of the first remaining portion of the substrate material member;

providing a sacrificial material member inside the first cavity; and removing the sacrificial material member when partially removing the first remaining portion of the substrate material member at two opposite sides of the sacrificial material member to form a second remaining portion of the substrate material member, wherein the second remaining portion of the substrate material member has a second cavity, wherein a flat sidewall of the second cavity is oriented at a second angle with respect to at least one of the horizontal plane, a flat bottom surface of the second cavity, and a flat bottom side of the second remaining portion of the substrate material member, and wherein the second angle is smaller than the first angle.

\* \* \* \* \*